(12) United States Patent
Hung et al.

(10) Patent No.: US 10,510,884 B2
(45) Date of Patent: Dec. 17, 2019

(54) METHOD FOR FABRICATING A SEMICONDUCTOR DEVICE

(71) Applicant: UNITED MICROELECTRONICS CORP., Hsin-Chu (TW)

(72) Inventors: Ching-Wen Hung, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/056,564

(22) Filed: Aug. 7, 2018

(65) Prior Publication Data

US 2018/0350937 A1    Dec. 6, 2018

Related U.S. Application Data

(62) Division of application No. 15/394,833, filed on Dec. 30, 2016, now Pat. No. 10,079,290.

(51) Int. Cl.
*H01L 29/66* (2006.01)
*H01L 21/8234* (2006.01)
(Continued)

(52) U.S. Cl.
CPC .... *H01L 29/7835* (2013.01); *H01L 21/31053* (2013.01); *H01L 21/31056* (2013.01); *H01L 21/823412* (2013.01); *H01L 21/823418* (2013.01); *H01L 21/823431* (2013.01); *H01L 21/823468* (2013.01); *H01L 21/823475* (2013.01); *H01L 29/4983* (2013.01); *H01L 29/6653* (2013.01); *H01L 29/6656* (2013.01); *H01L 29/66545* (2013.01); *H01L 29/66575* (2013.01); *H01L 29/66636* (2013.01); *H01L 29/66659* (2013.01); *H01L 29/66795* (2013.01);
(Continued)

(58) Field of Classification Search
CPC .......... H01L 29/7835; H01L 29/66659; H01L 29/4983; H01L 29/66545; H01L 29/6656; H01L 29/6653; H01L 29/7851; H01L 29/66795; H01L 29/0882; H01L 29/66575; H01L 21/823468; H01L 21/823412; H01L 29/0865; H01L 21/823418
See application file for complete search history.

(56) References Cited

U.S. PATENT DOCUMENTS 5,262,663 A    11/1993    Rho
5,274,261 A    12/1993    Chen
(Continued)

*Primary Examiner* — Sophia T Nguyen
(74) *Attorney, Agent, or Firm* — Winston Hsu

(57) ABSTRACT

A method for fabricating a semiconductor device is disclosed. A dummy gate is formed on a semiconductor substrate. The dummy gate has a first sidewall and a second sidewall opposite to the first sidewall. A low-k dielectric layer is formed on the first sidewall of the dummy gate and the semiconductor substrate. A spacer material layer is deposited on the low-k dielectric layer, the second sidewall of the dummy gate, and the semiconductor substrate. The spacer material layer and the low-k dielectric layer are etched to form a first spacer structure on the first sidewall and a second spacer structure on the second sidewall. A drain doping region is formed in the semiconductor substrate adjacent to the first spacer structure. A source doping region is formed in the semiconductor substrate adjacent to the second spacer structure.

6 Claims, 6 Drawing Sheets

(51) Int. Cl.
*H01L 29/08* (2006.01)
*H01L 29/78* (2006.01)
*H01L 29/49* (2006.01)
*H01L 21/3105* (2006.01)

(52) U.S. Cl.
CPC ...... *H01L 29/7833* (2013.01); *H01L 29/7848* (2013.01); *H01L 29/7851* (2013.01); *H01L 21/823437* (2013.01); *H01L 29/0865* (2013.01); *H01L 29/0882* (2013.01); *H01L 29/7834* (2013.01); *H01L 2029/7858* (2013.01)

(56) References Cited

U.S. PATENT DOCUMENTS

| | | |
|---|---|---|
| 5,411,906 A | 5/1995 | Johnson |
| 5,621,236 A | 4/1997 | Choi |
| 5,663,586 A | 9/1997 | Lin |
| 5,723,374 A | 3/1998 | Huang |
| 5,736,446 A | 4/1998 | Wu |
| 5,773,350 A | 6/1998 | Herbert |
| 5,783,458 A * | 7/1998 | Kadosh ............ H01L 21/28035 257/E21.194 |
| 5,789,298 A * | 8/1998 | Gardner ............ H01L 29/6656 257/E21.427 |
| 5,817,562 A | 10/1998 | Chang |
| 5,893,739 A * | 4/1999 | Kadosh ............ H01L 21/28035 257/E21.194 |
| 5,912,490 A | 6/1999 | Hebert |
| 5,918,124 A | 6/1999 | Sung |
| 5,985,724 A * | 11/1999 | Kadosh ............ H01L 21/28176 257/E21.194 |
| 6,027,964 A * | 2/2000 | Gardner ............ H01L 21/266 257/350 |
| 6,168,999 B1 * | 1/2001 | Xiang ............ H01L 29/66659 257/E21.248 |
| 6,613,637 B1 * | 9/2003 | Lee ............ H01L 29/66477 257/E21.409 |
| 6,794,256 B1 * | 9/2004 | Fuselier ............ H01L 21/823425 257/E21.411 |
| 6,967,143 B2 | 11/2005 | Mathew |
| 6,967,363 B1 * | 11/2005 | Buller ............ H01L 27/0629 257/288 |
| 7,067,366 B2 * | 6/2006 | Gehres ............ H01L 21/823814 257/E21.438 |
| 7,365,378 B2 | 4/2008 | Huang |
| 7,670,914 B2 | 3/2010 | Krivokapic |
| 7,892,928 B2 * | 2/2011 | Cheng ............ H01J 37/32733 257/E29.279 |
| 8,063,449 B2 | 11/2011 | Han |
| 8,299,508 B2 | 10/2012 | Hsieh |
| 8,421,166 B2 | 4/2013 | Chi |
| 8,507,991 B2 | 8/2013 | Wang |
| 8,592,911 B2 * | 11/2013 | Liang ............ H01L 21/28105 257/356 |
| 8,907,425 B2 * | 12/2014 | Itou ............ H01L 21/823807 257/368 |
| 9,142,649 B2 * | 9/2015 | Liu ............ H01L 29/6653 |
| 9,147,748 B1 * | 9/2015 | Xie ............ H01L 29/66545 |
| 9,236,447 B2 * | 1/2016 | Cheng ............ H01L 29/785 |
| 9,412,748 B2 * | 8/2016 | Hayashi ............ H01L 27/1157 |
| 9,466,565 B2 | 10/2016 | Bohr |
| 9,525,048 B2 | 12/2016 | Basker |
| 9,530,887 B1 | 12/2016 | Chang |
| 9,536,980 B1 | 1/2017 | Huang |
| 9,548,366 B1 * | 1/2017 | Ho ............ H01L 29/6656 |
| 9,608,065 B1 | 3/2017 | Bergendahl |
| 9,685,533 B1 * | 6/2017 | Kuo ............ H01L 29/66545 |
| 9,716,158 B1 * | 7/2017 | Cheng ............ H01L 29/4991 |
| 9,773,796 B2 * | 9/2017 | Lee ............ H01L 27/11529 |
| 9,780,193 B2 | 10/2017 | Lu |
| 9,831,118 B1 * | 11/2017 | Pang ............ H01L 21/7682 |
| 9,831,240 B1 * | 11/2017 | Park ............ H01L 29/66545 |
| 9,837,490 B2 * | 12/2017 | Park ............ H01L 29/0649 |
| 9,876,021 B2 * | 1/2018 | Wu ............ H01L 21/28282 |
| 10,079,290 B2 * | 9/2018 | Hung ............ H01L 29/4983 |
| 2003/0116781 A1 | 6/2003 | Ohuchi ............ H01L 21/2807 257/151 |
| 2006/0093756 A1 * | 5/2006 | Rajagopalan ........ C23C 16/4404 427/569 |
| 2006/0170016 A1 * | 8/2006 | Mathew ............ H01L 29/4983 257/288 |
| 2006/0172502 A1 * | 8/2006 | Chidambaram ...... H01L 21/324 438/303 |
| 2007/0145430 A1 * | 6/2007 | Sandhu ............ H01L 21/28114 257/288 |
| 2008/0026529 A1 * | 1/2008 | White ............ H01L 21/823814 438/275 |
| 2009/0159936 A1 * | 6/2009 | Shah ............ H01L 21/31155 257/288 |
| 2009/0227082 A1 * | 9/2009 | Shin ............ H01L 21/823807 438/294 |
| 2010/0019323 A1 * | 1/2010 | Shin ............ H01L 21/823814 257/369 |
| 2010/0047978 A1 * | 2/2010 | Tamura ............ H01L 21/823807 438/229 |
| 2010/0078736 A1 * | 4/2010 | Hoentschel ..... H01L 21/823425 257/408 |
| 2010/0181618 A1 * | 7/2010 | Meunier-Bellard .............. H01L 21/823418 257/344 |
| 2010/0258528 A1 * | 10/2010 | Singh ............ C09G 1/02 216/53 |
| 2010/0270627 A1 * | 10/2010 | Chang ............ H01L 21/28247 257/411 |
| 2011/0031538 A1 * | 2/2011 | Hsieh ............ H01L 29/6656 257/288 |
| 2011/0108930 A1 * | 5/2011 | Cheng ............ H01L 21/76831 257/412 |
| 2011/0237040 A1 * | 9/2011 | Ng ............ H01L 21/823425 438/303 |
| 2011/0266636 A1 * | 11/2011 | Rong ............ H01L 29/4983 257/408 |
| 2011/0291203 A1 | 12/2011 | Miyao |
| 2012/0049247 A1 | 3/2012 | Lee |
| 2012/0094459 A1 * | 4/2012 | Park ............ H01L 21/02068 438/299 |
| 2012/0235244 A1 * | 9/2012 | Yin ............ H01L 21/823807 257/368 |
| 2013/0037866 A1 * | 2/2013 | Thees ............ H01L 21/823468 257/288 |
| 2013/0200470 A1 * | 8/2013 | Liu ............ H01L 29/66795 257/408 |
| 2013/0320410 A1 | 12/2013 | Lin |
| 2013/0330482 A1 * | 12/2013 | Leu ............ C23C 16/345 427/579 |
| 2014/0004698 A1 * | 1/2014 | Huang ............ H01L 21/3212 438/653 |
| 2014/0248778 A1 * | 9/2014 | Moll ............ H01L 21/02107 438/696 |
| 2014/0252431 A1 * | 9/2014 | Lee ............ H01L 29/785 257/288 |
| 2014/0256094 A1 * | 9/2014 | Lin ............ H01L 29/66545 438/158 |
| 2014/0295629 A1 * | 10/2014 | Wen ............ H01L 21/823814 438/213 |
| 2014/0299937 A1 | 10/2014 | Teo |
| 2015/0076606 A1 * | 3/2015 | Cheng ............ H01L 29/66795 257/365 |
| 2015/0123175 A1 * | 5/2015 | Lin ............ H01L 29/402 257/288 |
| 2015/0145073 A1 | 5/2015 | Lee |
| 2015/0236113 A1 * | 8/2015 | Song ............ H01L 21/28123 257/411 |
| 2015/0249142 A1 | 9/2015 | Chen |
| 2015/0263122 A1 * | 9/2015 | Hsiao ............ H01L 29/515 257/401 |
| 2016/0013313 A1 * | 1/2016 | Cheng ............ H01L 29/267 257/408 |

(56) References Cited

U.S. PATENT DOCUMENTS

| | | | |
|---|---|---|---|
| 2016/0087063 A1* | 3/2016 | Yin | H01L 29/4916 |
| | | | 257/344 |
| 2016/0099245 A1* | 4/2016 | Cheng | H01L 27/0924 |
| | | | 257/401 |
| 2016/0148933 A1* | 5/2016 | Cheng | H01L 29/7848 |
| | | | 257/369 |
| 2016/0149017 A1* | 5/2016 | Tsai | H01L 29/66636 |
| | | | 257/288 |
| 2016/0155739 A1* | 6/2016 | Ting | H01L 29/0653 |
| | | | 257/401 |
| 2016/0172495 A1* | 6/2016 | Zhu | H01L 21/823412 |
| | | | 257/192 |
| 2016/0284700 A1* | 9/2016 | Yoon | H01L 27/0886 |
| 2016/0284820 A1* | 9/2016 | Basker | H01L 21/324 |
| 2016/0293721 A1 | 10/2016 | Chuang | |
| 2016/0343825 A1 | 11/2016 | Bae | |
| 2016/0351566 A1 | 12/2016 | Niimi | |
| 2017/0032971 A1 | 2/2017 | Pan | |
| 2017/0053916 A1* | 2/2017 | Ching | H01L 27/0924 |
| 2017/0069547 A1* | 3/2017 | Peng | H01L 21/823864 |
| 2017/0092487 A1* | 3/2017 | Kao | H01L 21/0206 |
| 2017/0110576 A1 | 4/2017 | Kim | |
| 2017/0207126 A1* | 7/2017 | Ching | H01L 21/823431 |
| 2017/0207337 A1 | 7/2017 | Chang | |
| 2017/0222008 A1* | 8/2017 | Hsu | H01L 27/0886 |
| 2017/0250281 A1* | 8/2017 | Tsai | H01L 29/7848 |
| 2017/0330801 A1* | 11/2017 | Ragnarsson | H01L 21/0214 |
| 2017/0365712 A1* | 12/2017 | Bu | H01L 29/7827 |
| 2018/0166560 A1* | 6/2018 | Chiang | H01L 21/82345 |
| 2018/0174904 A1 | 6/2018 | Hsieh | H01L 29/41766 |
| 2018/0190785 A1* | 7/2018 | Hung | H01L 29/4983 |
| 2018/0248012 A1* | 8/2018 | Morrow | H01L 27/1211 |
| 2019/0206859 A1* | 7/2019 | Balakrishnan | H01L 27/0617 |

* cited by examiner

METHOD FOR FABRICATING A SEMICONDUCTOR DEVICE

CROSS REFERENCE TO RELATED APPLICATIONS

This is a division of U.S. application Ser. No. 15/394,833 filed Dec. 30, 2016, which is included in its entirety herein by reference.

BACKGROUND OF THE INVENTION

1. Field of the Invention

The embodiments of the invention generally relate to a semiconductor device and a method for fabricating the same. More particularly, the embodiments of the invention relate to a method for fabricating a semiconductor FinFET device having a low-k dielectric layer incorporated into the spacer structure on the drain side of the semiconductor FinFET device.

2. Description of the Prior Art

Fin field effect transistors (FinFETs) are non-planar, multi-gate transistors having "fins" that perpendicularly extend from the gate and form the source and the drain of the transistor. Multiple FinFETs may be coupled to one another to provide an integrated circuit device. A conductive layer may be formed over the fins to provide a local interconnect between adjacent FinFETs.

The use of local interconnects enables a higher packing density and reduced $R_{SD}$. However, the formation of the slot contact of the local interconnects increases the parasitic fringe capacitance ($C_{of}$), which significantly degrades the circuit speed. Therefore, there is a need in this industry to provide an improved semiconductor device that is able to suppress capacitive coupling between the gate and the slot contact.

SUMMARY OF THE INVENTION

In one aspect, the present invention provides a semiconductor device including a semiconductor substrate, a gate on the semiconductor substrate, a drain doping region in the semiconductor substrate on a first side of the gate, a source doping region in the semiconductor substrate on a second side of the gate, a first spacer structure on a first sidewall of the gate between the gate and the drain doping region, and a second spacer structure on a second sidewall of the gate between the gate and the source doping region. The first spacer structure is composed of a low-k dielectric layer on the first sidewall of the gate and a first spacer material layer on the low-k dielectric layer. The second spacer structure is composed of a second spacer material layer on the second sidewall of the gate. The low-k dielectric layer has a dielectric constant that is smaller than that of the first spacer material layer or the second spacer material layer.

In another aspect, a method for fabricating a semiconductor device is disclosed. A semiconductor substrate is provided. A dummy gate is formed on the semiconductor substrate. The dummy gate has a first sidewall and a second sidewall opposite to the first sidewall. A low-k dielectric layer is formed on the first sidewall of the dummy gate and the semiconductor substrate. A spacer material layer is deposited on the low-k dielectric layer, the second sidewall of the dummy gate, and the semiconductor substrate. The spacer material layer and the low-k dielectric layer are etched to form a first spacer structure on the first sidewall and a second spacer structure on the second sidewall. A drain doping region is formed in the semiconductor substrate adjacent to the first spacer structure. A source doping region is formed in the semiconductor substrate adjacent to the second spacer structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
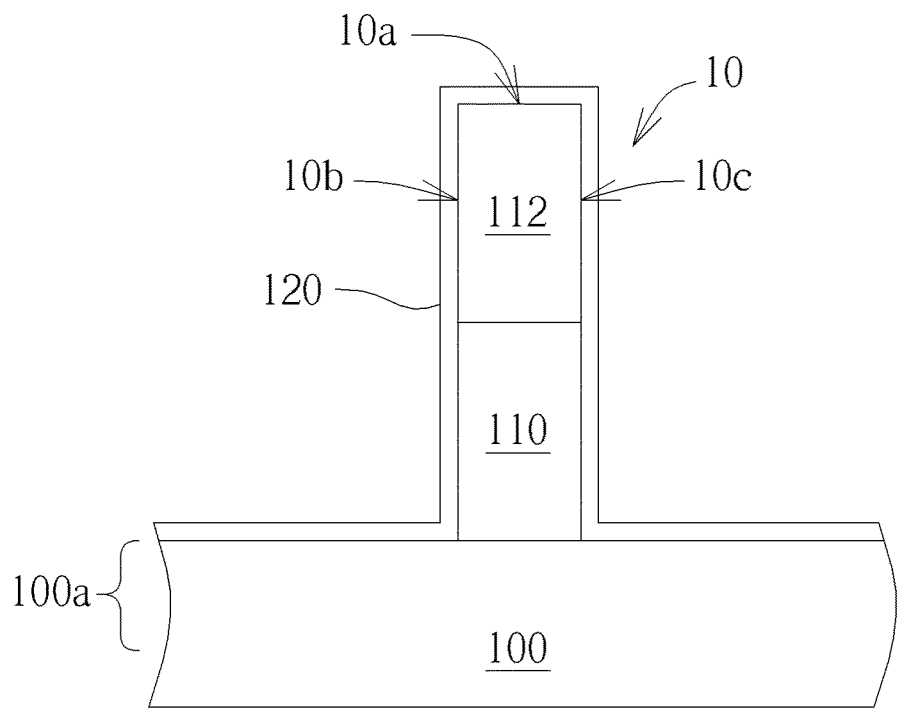
FIG. 1 to FIG. 10 are schematic, cross-sectional diagrams showing an exemplary method for fabricating a semiconductor FinFET device according to one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

Figure 9:
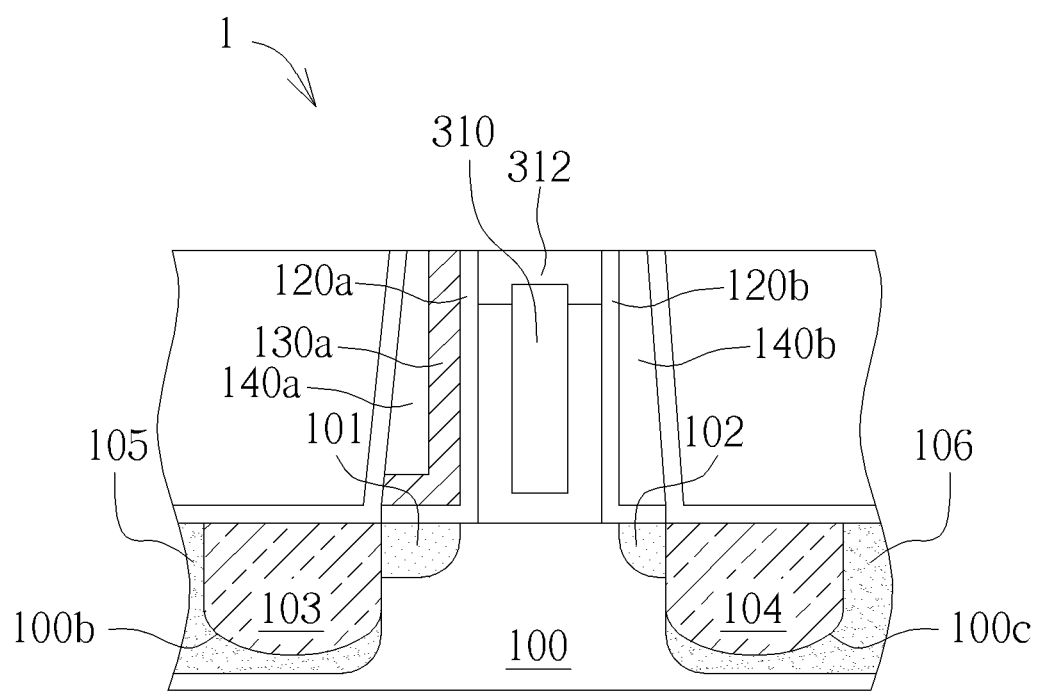
Figure 10:
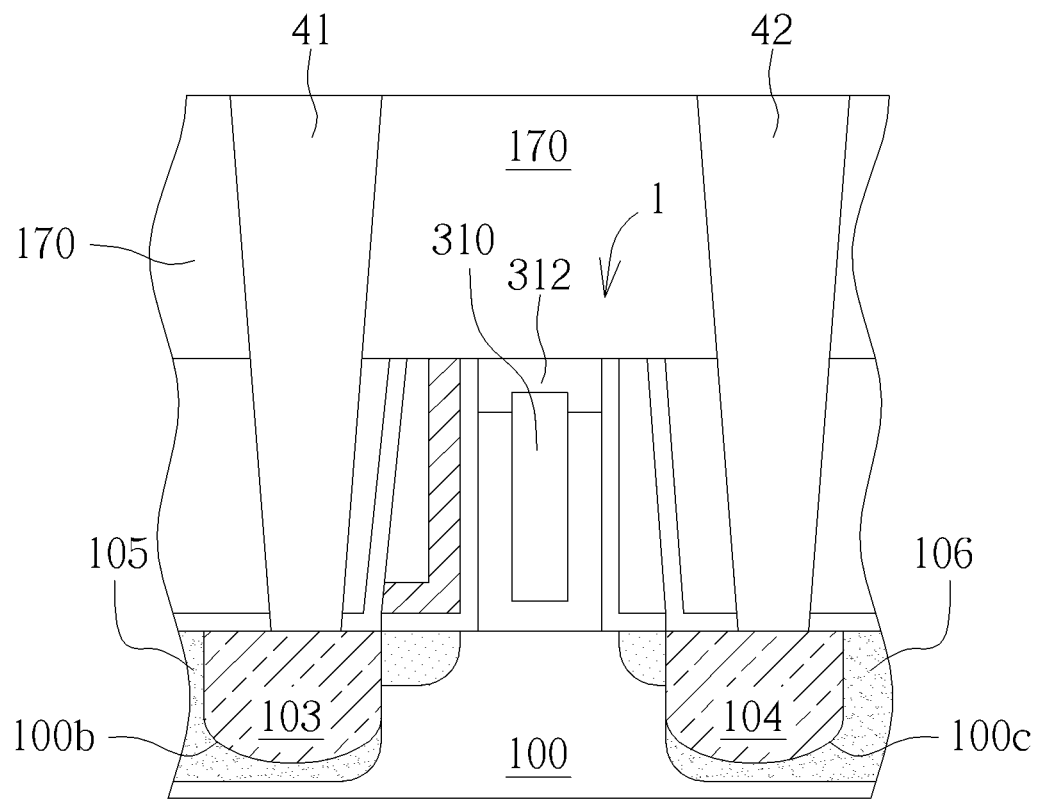
Figure 11:
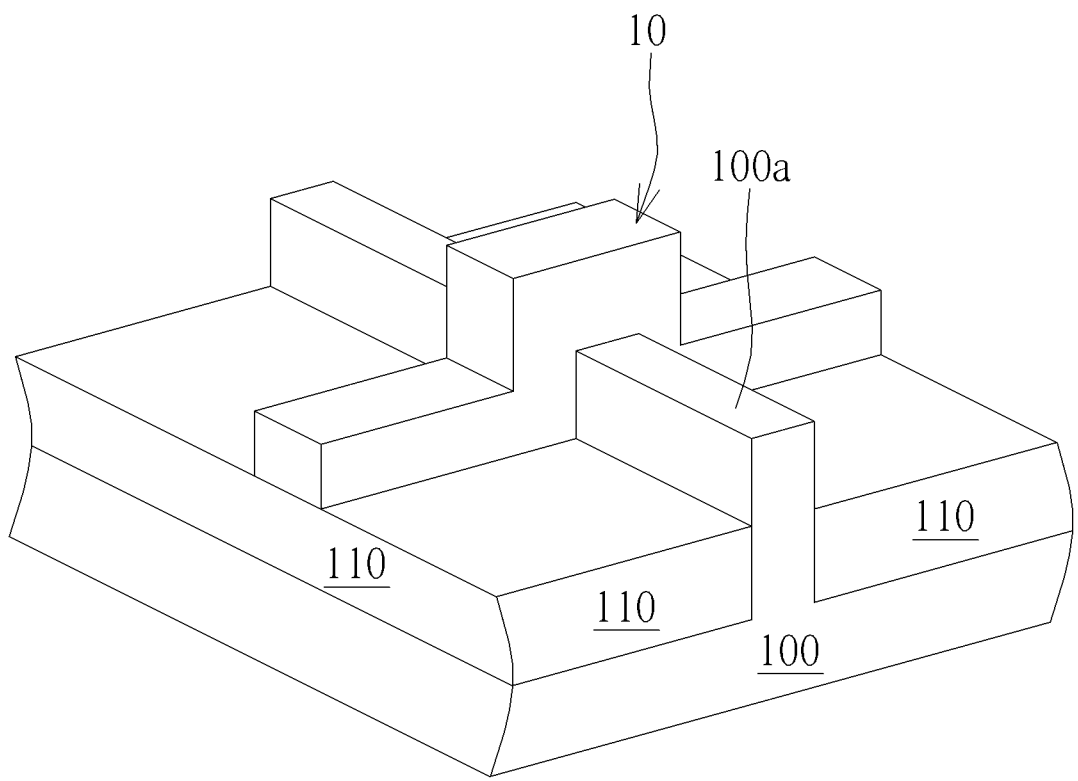
FIG. 11 is a schematic, perspective view showing a fin structure and a gate structure according to one embodiment of the invention.

Please refer to FIG. 1 to FIG. 11. FIG. 1 to FIG. 10 are schematic, cross-sectional diagrams showing an exemplary method for fabricating a semiconductor FinFET device according to one embodiment of the invention. FIG. 11 is a schematic, perspective view showing a fin structure and a gate structure according to one embodiment of the invention.

As shown in FIG. 1 and FIG. 11, a semiconductor substrate 100 is provided. The semiconductor substrate 100 may comprise single crystalline silicon, SiGe, silicon-on-insulator (SOI), or epitaxial silicon, but is not limited thereto. According to one embodiment of the invention, the semiconductor substrate 100 may comprise a fin structure 100a that protrudes from a top surface of the surrounding shallow trench isolation (STI) region 110, as can be seen in FIG. 11.

A gate structure 10 may be formed on the semiconductor substrate 100. The gate structure 10 may extend across the fin structure 100a. According to one embodiment of the invention, the gate structure 10 may comprise a polysilicon layer 110 and a hard mask 112 such as silicon nitride capping the polysilicon layer 110.

It is understood that the gate structure 10 may comprise other materials or layers in other embodiments. According to one embodiment of the invention, the gate structure 10 is a dummy gate and will be replaced with a metal gate in a later stage.

According to one embodiment of the invention, the gate structure 10 may have a top surface 10a and two opposite sidewalls 10b and 10c. According to one embodiment of the invention, the sidewall 10b is on the drain side (Drain) of the gate structure 10 and the sidewall 10c is on the source side (Source) of the gate structure 10.

Subsequently, a seal layer 120 is conformally deposited on the top surface 10a and two opposite sidewalls 10b and 10c of the gate structure 10 and on the semiconductor substrate 100. According to one embodiment of the invention, the seal layer 120 may comprise silicon nitride or silicon oxide, but is not limited thereto.

According to one embodiment of the invention, the seal layer 120 may have a thickness ranging between 10 and 50 angstroms, for example, 30 angstroms. According to one embodiment of the invention, the seal layer 120 may be deposited by using chemical vapor deposition (CVD) or atomic layer deposition (ALD) methods, but is not limited thereto.

Figure 2:
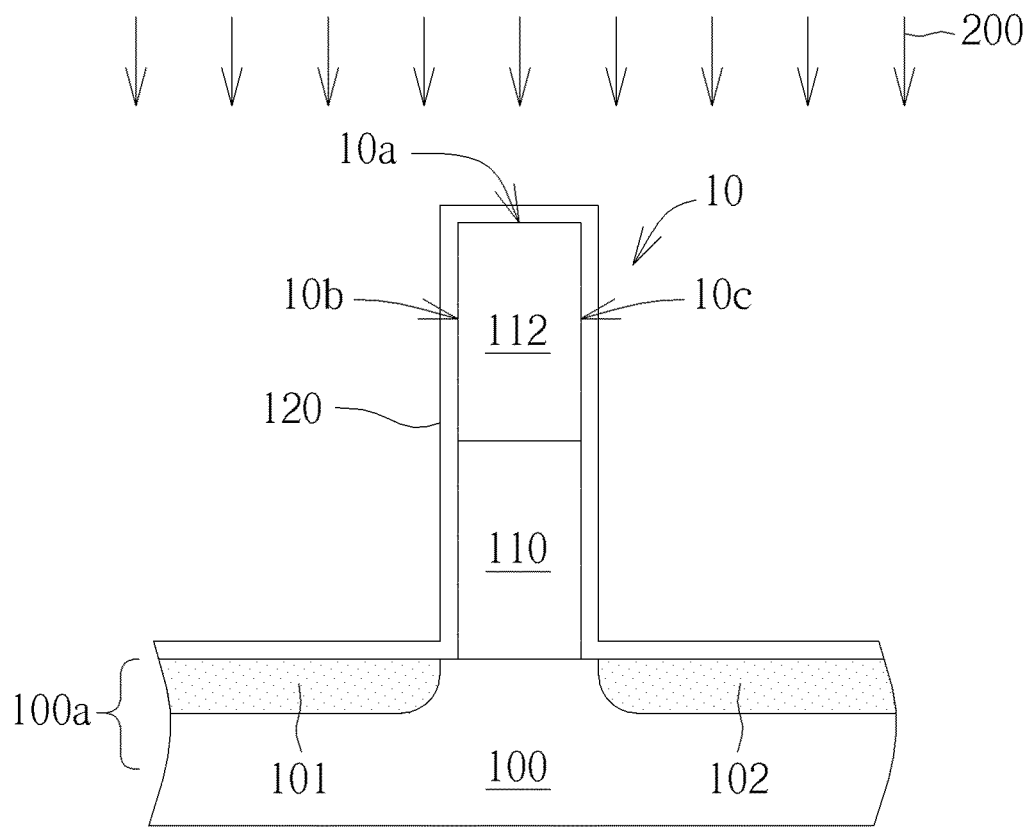

As shown in FIG. 2, an ion implantation process 200 is performed to implant N-type or P-type dopants into the semiconductor substrate 100. Thereafter, an anneal process such as a rapid thermal process (RTP) is performed to thereby form a first lightly doped drain (LDD) region 101 on the drain side (Drain) of the gate structure 10 and a second LDD region 102 on the source side (Source) of the gate structure 10. The first LDD region 101 is adjacent to the sidewall 10b and the second LDD region 102 is adjacent to the sidewall 10c. The first and second LDD regions 101 and 102 may be N-type or P-type depending upon the types of the semiconductor FinFET device.

Figure 3:
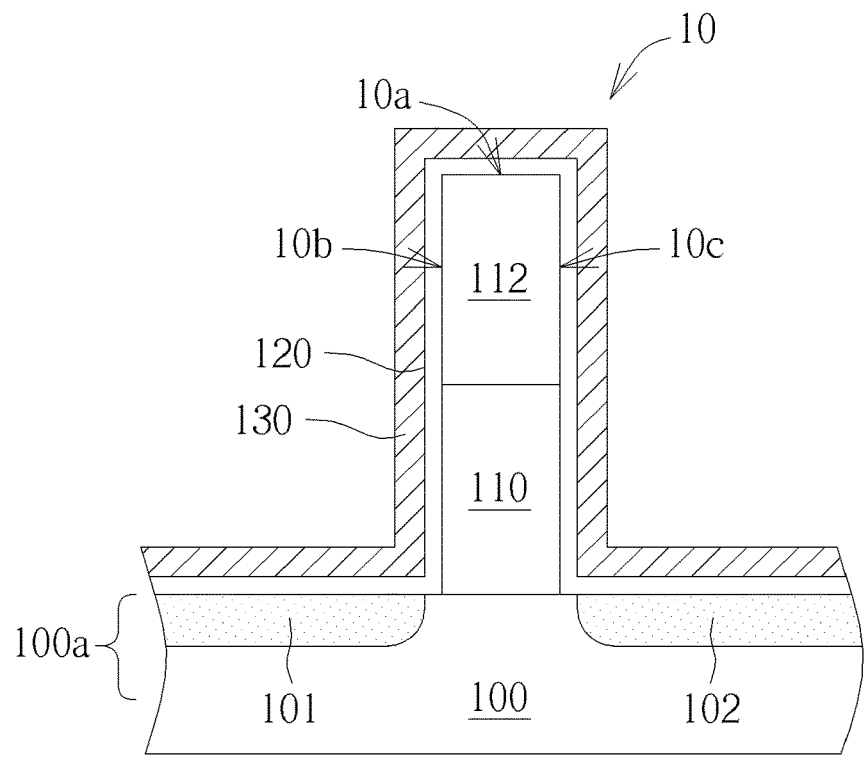

As shown in FIG. 3, a low-k dielectric layer 130 is conformally deposited on the gate structure 10 and on the semiconductor substrate 100. According to one embodiment of the invention, the low-k dielectric layer 130 is deposited on the seal layer 120 and is in direct contact with the seal layer 120.

According to one embodiment of the invention, the low-k dielectric layer 130 may have a dielectric constant that is smaller than or equal to 5.0. According to another embodiment of the invention, the low-k dielectric layer 130 may have a dielectric constant ranging between 0 and 4.0. According to still another embodiment of the invention, the low-k dielectric layer 130 may have a dielectric constant ranging between 0 and 3.0.

For example, the low-k dielectric layer 130 may comprise silicon oxycarbonitride (SiOCN), silicon carbide (SiC), or black diamond, but is not limited thereto. According to one embodiment of the invention, the low-k dielectric layer 130 may be deposited by using CVD or ALD methods, but is not limited thereto.

According to one embodiment of the invention, the low-k dielectric layer 130 may have a thickness ranging between 50 and 100 angstroms, for example, 70 angstroms. In another embodiment, the seal layer 120 may comprise low-k dielectric materials. In this case, the above-mentioned low-k dielectric layer 130 may be spared.

Figure 4:
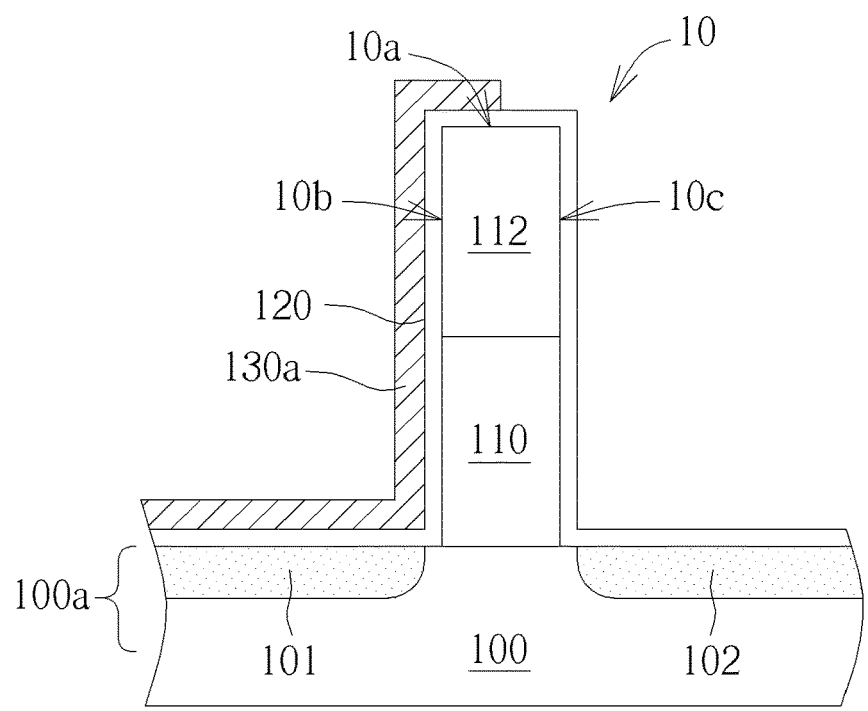

As shown in FIG. 4, a lithographic process and etching process are performed to partially remove the low-k dielectric layer 130 from the source side (Source) of the gate structure 10, while leaving the low-k dielectric layer 130 on the drain side (Drain) of the gate structure 10 intact. In a case that the seal layer 120 is a low-k dielectric layer (the low-k dielectric layer 130 is spared), the seal layer 120 is partially removed from the source side (Source) of the gate structure 10.

After removing the low-k dielectric layer 130 from the source side (Source) of the gate structure 10, the seal layer 120 on the sidewalls 10c of the gate structure 10 and on the second LDD region 102 is exposed. A portion of the seal layer 120 on the top surface 10a of the gate structure 10 may be exposed. The remaining low-k dielectric layer 130a is disposed only on the drain side (Drain) of the gate structure 10 and does not cover the sidewall 10c of the gate structure 10.

Figure 5:
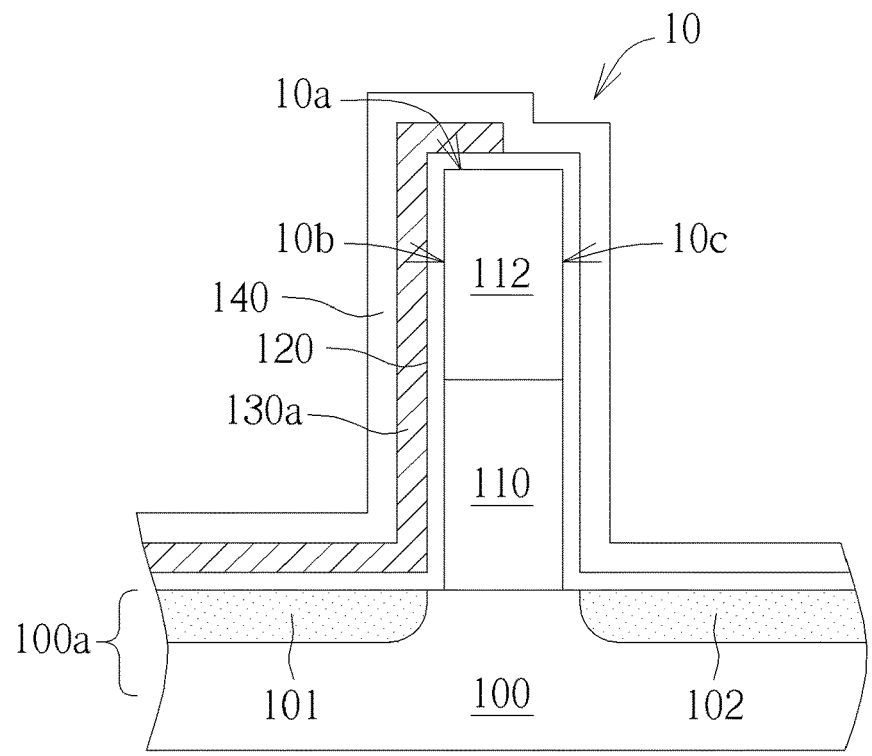

As shown in FIG. 5, a spacer material layer 140 is then deposited on the remaining low-k dielectric layer 130a, on the seal layer 120 on the sidewall 10c of the gate structure 10, and on the semiconductor substrate 100. The spacer material layer 140 conformally covers the remaining low-k dielectric layer 130a, the gate structure 10, and the semiconductor substrate 100. On the drain side (Drain) of the gate structure 10, the spacer material layer 140 is not in direct contact with the seal layer 120. On the source side (Source) of the gate structure 10, the spacer material layer 140 is in direct contact with the seal layer 120.

For example, the spacer material layer 140 may comprise silicon nitride or silicon carbonitride, but is not limited thereto. According to one embodiment of the invention, the spacer material layer 140 may be deposited by using CVD or ALD methods, but is not limited thereto. According to one embodiment of the invention, the spacer material layer 140 may have a thickness ranging between 50 and 100 angstroms, for example, 80 angstroms.

Figure 6:
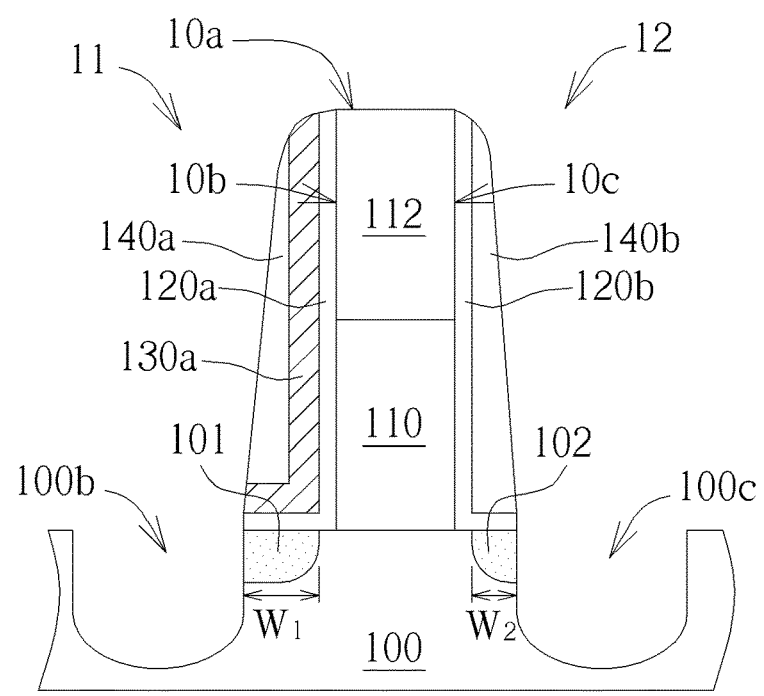

As shown in FIG. 6, subsequently, the spacer material layer 140 and the low-k dielectric layer 130a are etched in an anisotropic manner, thereby forming a first spacer structure 11 on the sidewall 10b and a second spacer structure 12 on the sidewall 10c of the gate structure 10. The first spacer structure 11 and the second spacer structure 12 have different film structure, thereby forming an asymmetric spacer configuration.

According to one embodiment of the invention, the first spacer structure 11 comprises a first seal layer 120a on the sidewall 10b of the gate structure 10, low-k dielectric layer 130a directly on the first seal layer 120a, and a first spacer material layer 140a directly on the low-k dielectric layer 130a. The second spacer structure 12 comprises a second seal layer 120b on the sidewall 10c of the gate structure 10 and a second spacer material layer 140b directly on the second seal layer 120b. The low-k dielectric layer 130a has a dielectric constant that is smaller than that of the first spacer material layer 140a or the second spacer material layer 140b.

According to one embodiment of the invention, after forming the first spacer structure 11 and the second spacer structure 12, the top surface of the hard mask 112 may be exposed. According to one embodiment of the invention, the etching process may continue to etch the semiconductor substrate 100 in a self-aligned manner, thereby forming a first recess 100b adjacent to the first spacer structure 11 and a second recess 100b adjacent to the second spacer structure 12.

It is noteworthy that since the first spacer structure 11 has a bottom thickness that is greater than that of the second spacer structure 12, the distance between an edge of the first recess 100b and the sidewall 10b is greater than the distance between an edge of the second recess 100c and the sidewall 10c. It is noteworthy that the first LDD region 101 that is situated directly under the first spacer structure 11 has a width that is greater than that of the second LDD region 102 that is situated directly under the second spacer structure 12 ($w_1 > w_2$).

Figure 7:
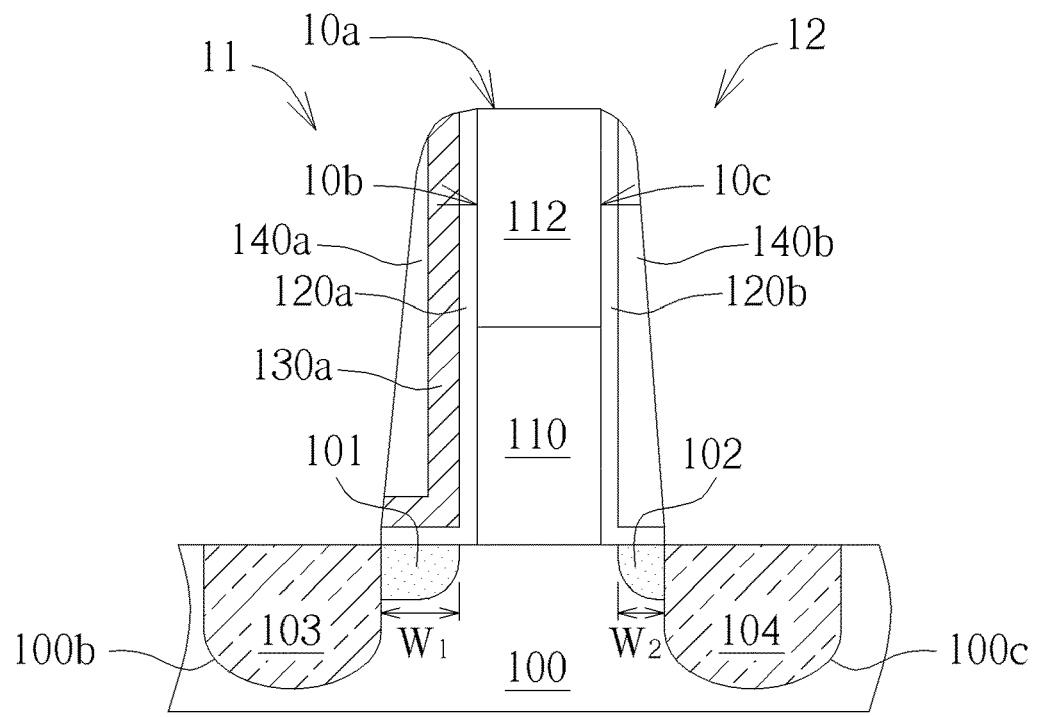

As shown in FIG. 7, an epitaxial growth process is then carried out to form a first epitaxial layer 103 in the first recess 100b and a second epitaxial layer 104 in the second recess 100c. According to one embodiment of the invention, the first epitaxial layer 103 and the second epitaxial layer 104 may comprise SiP, SiC, or SiGe, but is not limited thereto.

Figure 8:
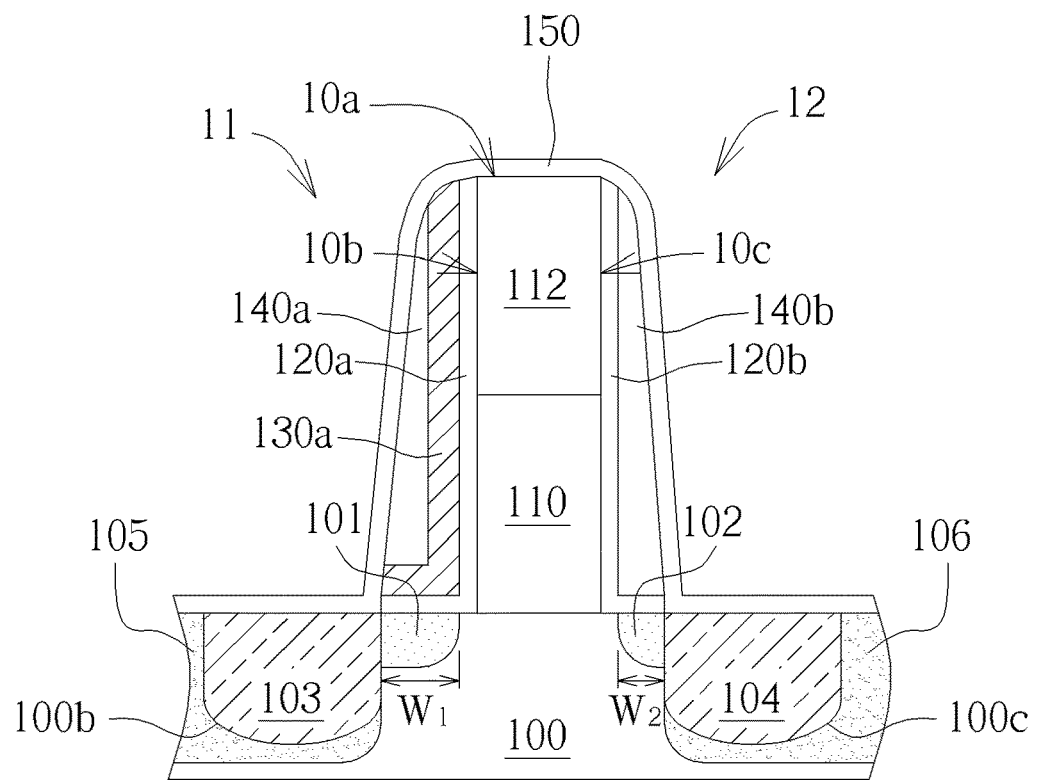

As shown in FIG. 8, after forming the first epitaxial layer 103 and the second epitaxial layer 104, an ion implantation process is carried out to form a drain doping region 105 in the semiconductor substrate 100 adjacent to the first spacer structure 11 and a source doping region 106 in the semiconductor substrate 100 adjacent to the second spacer structure 12.

According to one embodiment of the invention, the conductivity type of the drain doping region 105 and the source doping region 106 may be identical to the conductivity type of the first LDD region 101 and the second LDD region 102, but is not limited thereto. According to one embodiment of the invention, the drain doping region 105 and the source doping region 106 are typically heavily doped regions that have doping concentration greater than that of the first LDD region 101 and the second LDD region 102.

Subsequently, a contact etch stop layer (CESL) 150 is conformally deposited over the semiconductor substrate 100. The contact etch stop layer 150 covers the drain doping region 105, the source doping region 106, the first spacer material layer 140a, and the second spacer material layer 140b.

As shown in FIG. 9, an inter-layer dielectric (ILD) layer 160 is deposited on the contact etch stop layer 150. The ILD layer 160 may comprise silicon oxide, silicon nitride, the like, or a combination thereof. The ILD layer 160 may be formed by CVD, a high-density plasma (HDP), the like, or a combination thereof. The ILD layer 160 may be planarized to a top surface of the gate structure 10. For example, the ILD layer 160 may be planarized by using a CMP to remove an upper portion of the ILD layer 160. According to one embodiment of the invention, the ILD layer 160, the contact etch stop layer 150, the first spacer structure 11, and second spacer structure 12 are planarized, thereby exposing the gate structure 10.

The hard mask 112 and the polysilicon layer 110 are removed to form a gate trench. A metal gate 310 may be formed within the gate trench by using conventional replacement metal gate (RMG) processes. Optionally, a hard mask 312 may be formed within the gate trench on the metal gate 310. A semiconductor FinFET device 1 is completed.

As shown in FIG. 10, an inter-layer dielectric (ILD) layer 170 is deposited on the ILD layer 160 and the semiconductor FinFET device 1. A first slot contact 41 is formed in the ILD layer 170 and the ILD layer 160 to electrically couple to the drain doping region 105. A second slot contact 42 is formed in the ILD layer 170 and the ILD layer 160 to electrically couple to the source doping region 106.

The present invention is advantageous over the prior art because the semiconductor FinFET device 1 comprises a low-k dielectric layer 130a incorporated into the first spacer structure 11 on the drain side of the semiconductor FinFET device 1. The low-k dielectric layer 130a is interposed between the first spacer material layer 140a and the metal gate 310. The low-k dielectric layer 130a have low dielectric constant (k≤5.0) and is able to suppress the parasitic fringe capacitance ($C_{of}$), thereby improving the device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for fabricating a semiconductor device, comprising:
   providing a semiconductor substrate;
   forming a dummy gate on the semiconductor substrate, wherein the dummy gate has a first sidewall and a second sidewall opposite to the first sidewall;
   forming a low-k dielectric layer on the first sidewall and the second sidewall of the dummy gate and the semiconductor substrate, wherein the dielectric constant of the low-k dielectric layer is smaller than or equal to 5, and wherein the low-k dielectric layer comprises silicon carbide (SiC) or black diamond;
   partially etching the low-k dielectric layer on the second sidewall but not the first sidewall of the dummy gate, and partially etching the low-k dielectric layer on top of the dummy gate, so that the low-k dielectric layer is remained on the first sidewall, but not on the second sidewall of the dummy gate, and remained partially on top of the dummy gate;
   depositing a spacer material layer on the low-k dielectric layer, the second sidewall of the dummy gate, and the semiconductor substrate;
   etching the spacer material layer and the low-k dielectric layer to form a first spacer structure on the first sidewall and a second spacer structure on the second sidewall, wherein the first spacer structure has a bottom thickness that is greater than that of the second spacer structure, and the first spacer structure has a first spacer material layer and the low-k dielectric layer, but the second spacer structure has a second spacer material layer but does not have the low-k dielectric layer;
   etching the semiconductor substrate to form a first recess adjacent to the first spacer structure and a second recess adjacent to the second spacer structure;
   forming a first epitaxial layer in the first recess and a second epitaxial layer in the second recess;
   forming a drain doping region in the semiconductor substrate adjacent to the first spacer structure and a source doping region in the semiconductor substrate adjacent to the second spacer structure; and
   forming a first slot contact on the drain doping region and a second slot contact on the source doping region.

2. The method for fabricating a semiconductor device according to claim 1, wherein after forming the dummy gate on the semiconductor substrate and before depositing the low-k dielectric layer over the dummy gate and the semiconductor substrate, the method further comprises:

depositing a seal layer over the dummy gate and the semiconductor substrate; and forming a first lightly doped drain (LDD) region in the semiconductor substrate adjacent to the first sidewall and a second lightly doped drain (LDD) region in the semiconductor substrate adjacent to the second sidewall.

3. The method for fabricating a semiconductor device according to claim 2, wherein the seal layer comprises silicon nitride.

4. The method for fabricating a semiconductor device according to claim 1, wherein the dummy gate has an asymmetric spacer configuration by having the low-k dielectric layer of L-shape disposed only on one side thereof.

5. The method for fabricating a semiconductor device according to claim 1, wherein after forming the drain doping region in the semiconductor substrate adjacent to the first spacer structure and the source doping region in the semiconductor substrate adjacent to the second spacer structure, the method further comprises:

forming a contact etch stop layer to cover the drain doping region, the source doping region, the first spacer structure, and the second spacer structure;

depositing an inter-layer dielectric (ILD) layer on the contact etch stop layer;

polishing the ILD layer, the contact etch stop layer, the first spacer structure, and second spacer structure, thereby exposing the dummy gate; and replacing the dummy gate with a metal gate, wherein the metal gate is covered by a hard mask, and top surface of the hard mask is coplanar with top surface of the ILD layer.

6. The method for fabricating a semiconductor device according to claim 5, wherein the contact etch stop layer comprises silicon nitride.

\* \* \* \* \*